US011683895B2

(12) United States Patent
Wingfield

(10) Patent No.: US 11,683,895 B2
(45) Date of Patent: Jun. 20, 2023

(54) SLIM PROFILE LATCH FOR USE IN AN INFORMATION HANDLING SYSTEM CHASSIS

(71) Applicant: Dell Products L.P., Round Rock, TX (US)

(72) Inventor: Megan Cherie Wingfield, Box Elder, SD (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/515,997

(22) Filed: Nov. 1, 2021

(65) Prior Publication Data

US 2023/0133031 A1 May 4, 2023

(51) Int. Cl.
*H05K 5/02* (2006.01)

(52) U.S. Cl.
CPC ......... *H05K 5/0221* (2013.01); *H05K 5/0204* (2013.01); *H05K 5/0286* (2013.01)

(58) Field of Classification Search
CPC ....................................................... G06F 1/187
See application file for complete search history.

(56) References Cited

U.S. PATENT DOCUMENTS 5,820,175 A * 10/1998 Clavin .................... E05C 1/145
292/DIG. 31
2018/0160563 A1* 6/2018 Hung .................. H05K 7/1409

* cited by examiner

*Primary Examiner* — Jerry Wu
(74) *Attorney, Agent, or Firm* — Jackson Walker L.L.P.

(57) ABSTRACT

An information handling resource may include a housing configured to enclose components of the information handling resource and a latch comprising a body and a purchase. The body may be coupled to the housing such that the latch is rotatable relative to the housing about an axis parallel to an exterior face of the housing and further rotatable in a plane perpendicular to the exterior face such that the body is rotatable from a closed position relative to the housing to an open position relative to the housing and vice versa. The purchase may be coupled to the body such that the purchase is rotatable relative to the body about an axis parallel to the plane in which the body rotates relative to the housing such that the purchase is rotatable from a first position relative to the body to a second position relative to the body and vice versa.

17 Claims, 6 Drawing Sheets

SLIM PROFILE LATCH FOR USE IN AN INFORMATION HANDLING SYSTEM CHASSIS

TECHNICAL FIELD

The present disclosure relates to modular information handling systems. More specifically, embodiments of the disclosure provide systems and methods for a gear train side latching mechanism for a modular information handling resource.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis. In traditional modular systems, information handling resources (including hard disk drives) and their corresponding chassis bays are typically accessed from a side of the chassis in which the information handling resources may be added or removed.

It is desirable in most instances to provide users (e.g., information technology technicians or administrators) a convenient way to insert and remove information handling resources from a chassis. For instance, when a user desires to remove an information handling resource from a chassis, a mating force between electrical connectors on the information handling resource and within the chassis, along with other mechanical forces (e.g., friction between the chassis and the information handling resource) must be overcome for removal. However, server density continues to increase with every new generation of products, and the need to expand server width to allow more payload and increased airflow is becoming more critical. This server density has led to height and size restrictions of many information handling resources and associated chassis slots, thus rendering it difficult to provide sufficient mechanical advantage for easy removal of information handling resources.

SUMMARY

In accordance with the teachings of the present disclosure, the disadvantages and problems associated with traditional approaches to insertion and removal of modular information handling resources in a chassis have been substantially reduced or eliminated.

In accordance with embodiments of the present disclosure, an information handling resource may include a housing configured to enclose components of the information handling resource and a latch comprising a body and a purchase. The body may be mechanically coupled to the housing such that the latch is rotatable relative to the housing about an axis parallel to an exterior face of the housing and further rotatable in a plane perpendicular to the exterior face such that the body is rotatable from a closed position relative to the housing to an open position relative to the housing and vice versa. The purchase may be mechanically coupled to the body such that the purchase is rotatable relative to the body about an axis parallel to the plane in which the body rotates relative to the housing such that the purchase is rotatable from a first position relative to the body to a second position relative to the body and vice versa, such that when in the second position, the purchase provides a mechanical advantage for removal of the information handling resource from an information handling system.

In accordance with these and other embodiments of the present disclosure, a latch may include a body and a purchase. The body may be configured to mechanically couple to a housing of an information handling system such that the latch is rotatable relative to the housing about an axis parallel to an exterior face of the housing and further rotatable in a plane perpendicular to the exterior face such that the body is rotatable from a closed position relative to the housing to an open position relative to the housing and vice versa. The purchase may be mechanically coupled to the body such that the purchase is rotatable relative to the body about an axis parallel to the plane in which the body rotates relative to the housing such that the purchase is rotatable from a first position relative to the body to a second position relative to the body and vice versa, such that when in the second position, the purchase provides a mechanical advantage for removal of the information handling resource from an information handling system.

In accordance with these and other embodiments of the present disclosure, a method may include mechanically coupling a body of a latch to a housing of an information handling resource such that the latch is rotatable relative to the housing about an axis parallel to an exterior face of the housing and further rotatable in a plane perpendicular to the exterior face such that the body is rotatable from a closed position relative to the housing to an open position relative to the housing and vice versa. The method may also include mechanically coupling a purchase of the latch to the body such that the purchase is rotatable relative to the body about an axis parallel to the plane in which the body rotates relative to the housing such that the purchase is rotatable from a first position relative to the body to a second position relative to the body and vice versa, such that when in the second position, the purchase provides a mechanical advantage for removal of the information handling resource from an information handling system.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 3C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
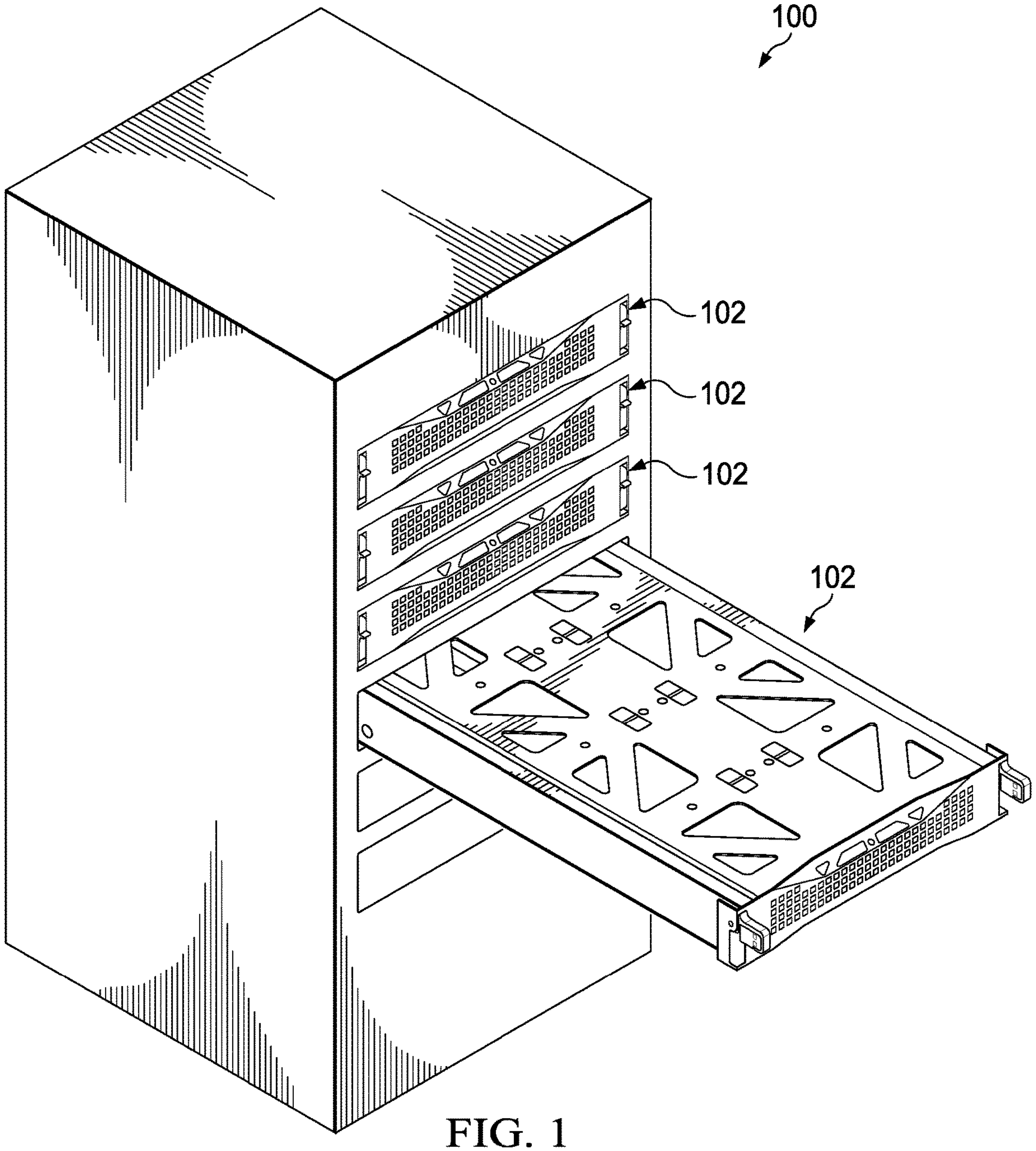
FIG. 1 illustrates a front perspective view of an example chassis for receiving modular information handling resources, in accordance with embodiments of the present disclosure.

FIG. 1 illustrates a front perspective view of an example chassis 100 for receiving modular information handling resources 102, in accordance with embodiments of the present disclosure. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more bays for receiving modular information handling resources 102.

Figure 2A:
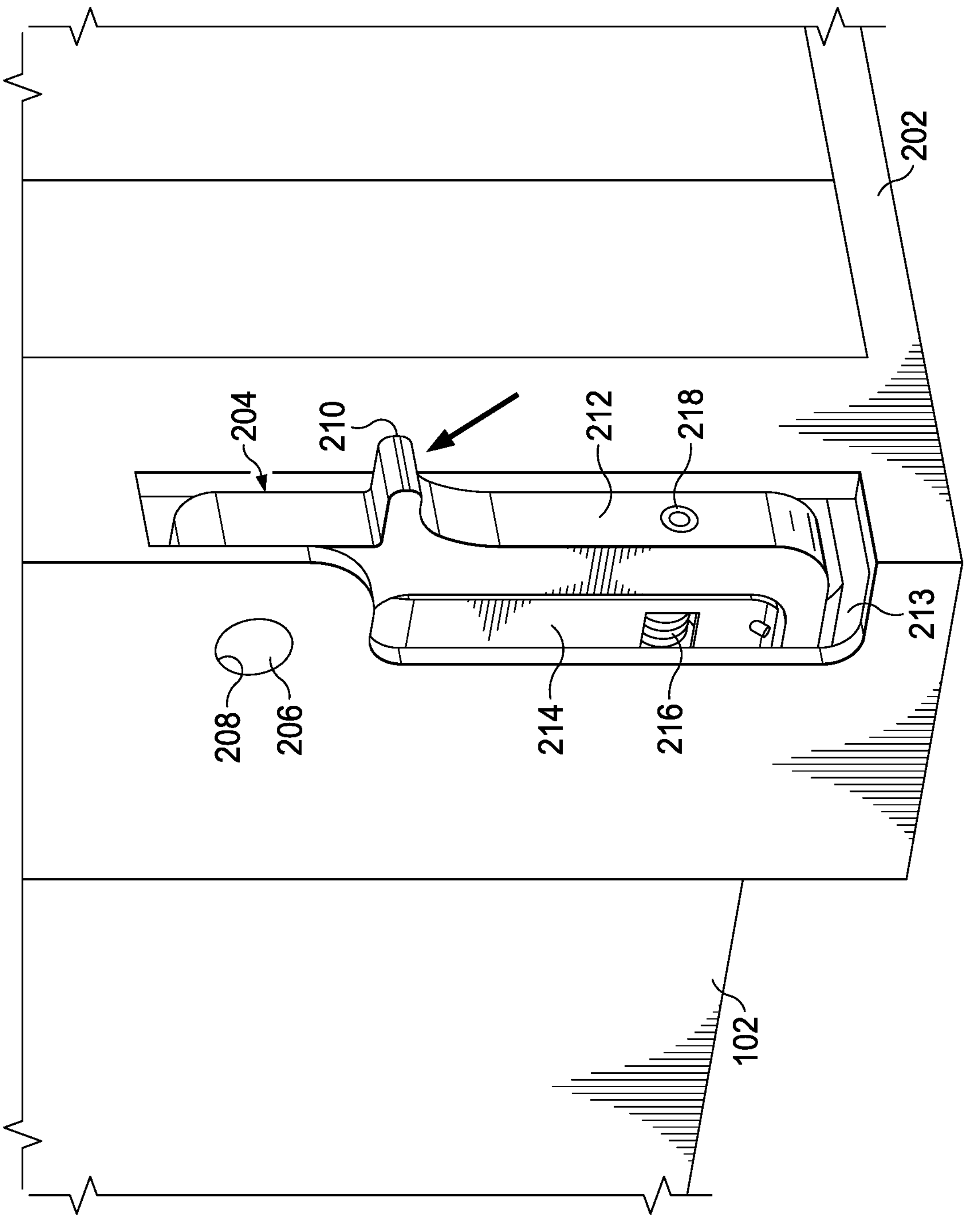
FIGS. 2A-2C illustrate a detailed front perspective view of an example modular information handling resource including a slim profile latch, in accordance with embodiments of the present disclosure.
Figure 2B:
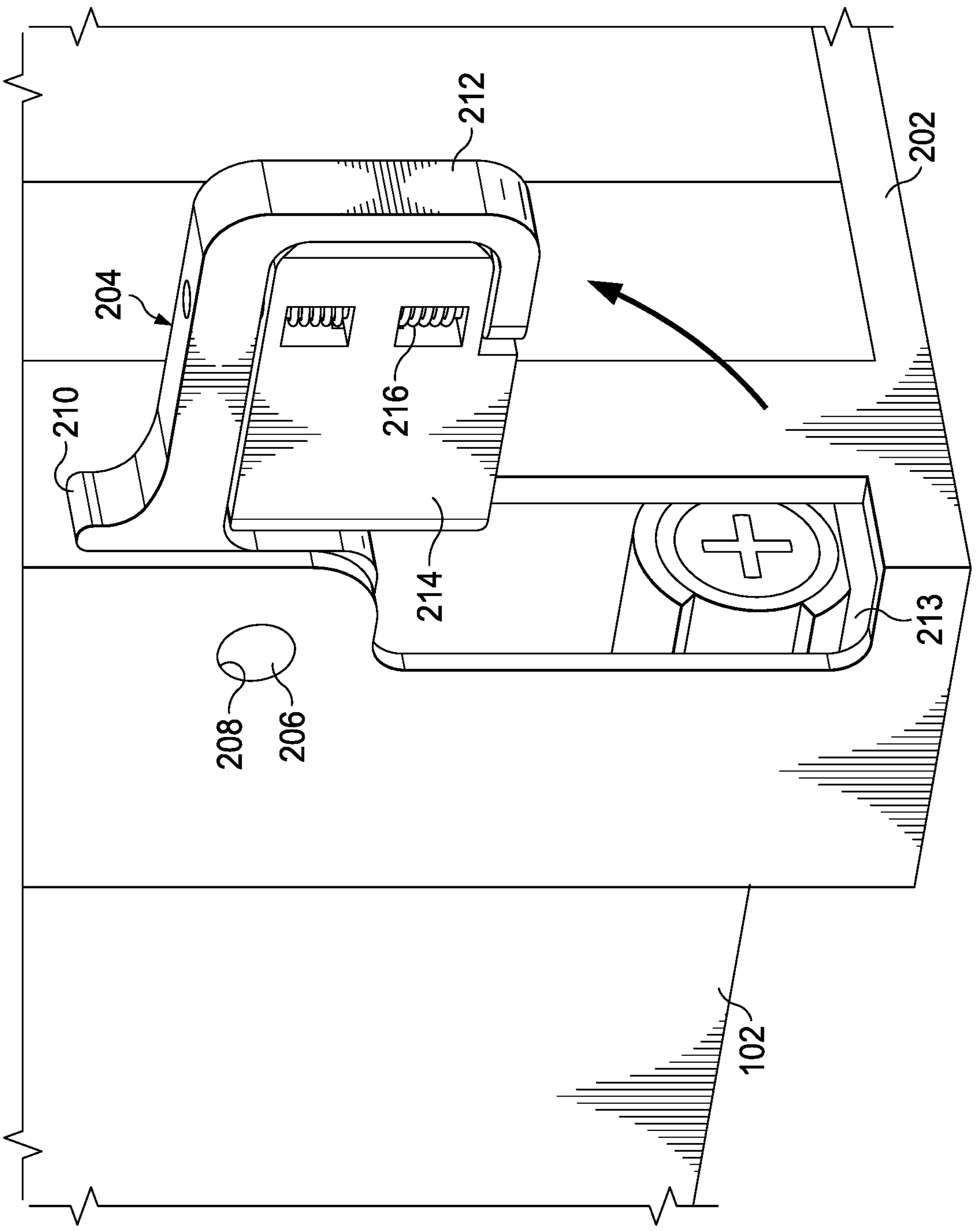
Figure 2C:
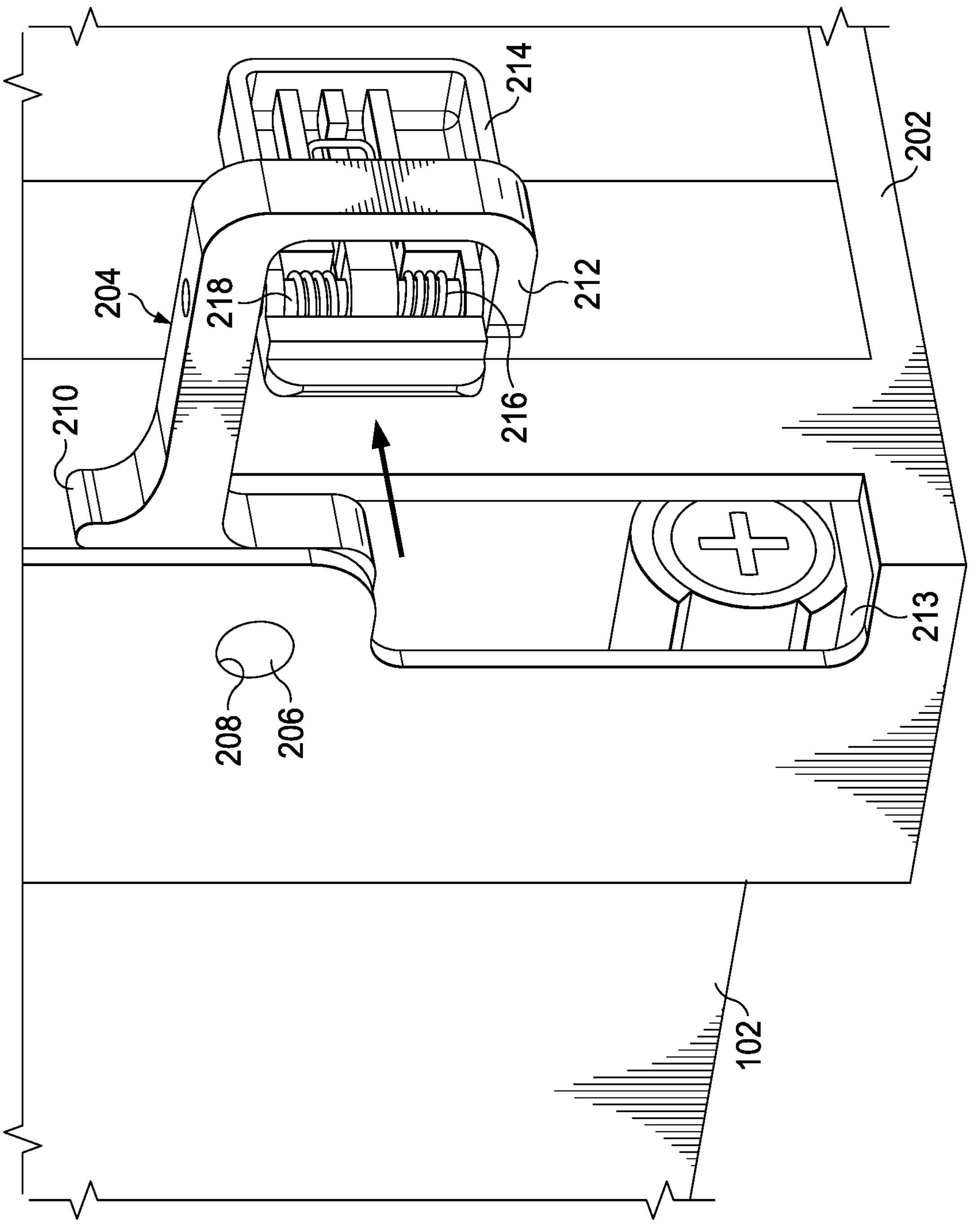
Figure 3B:
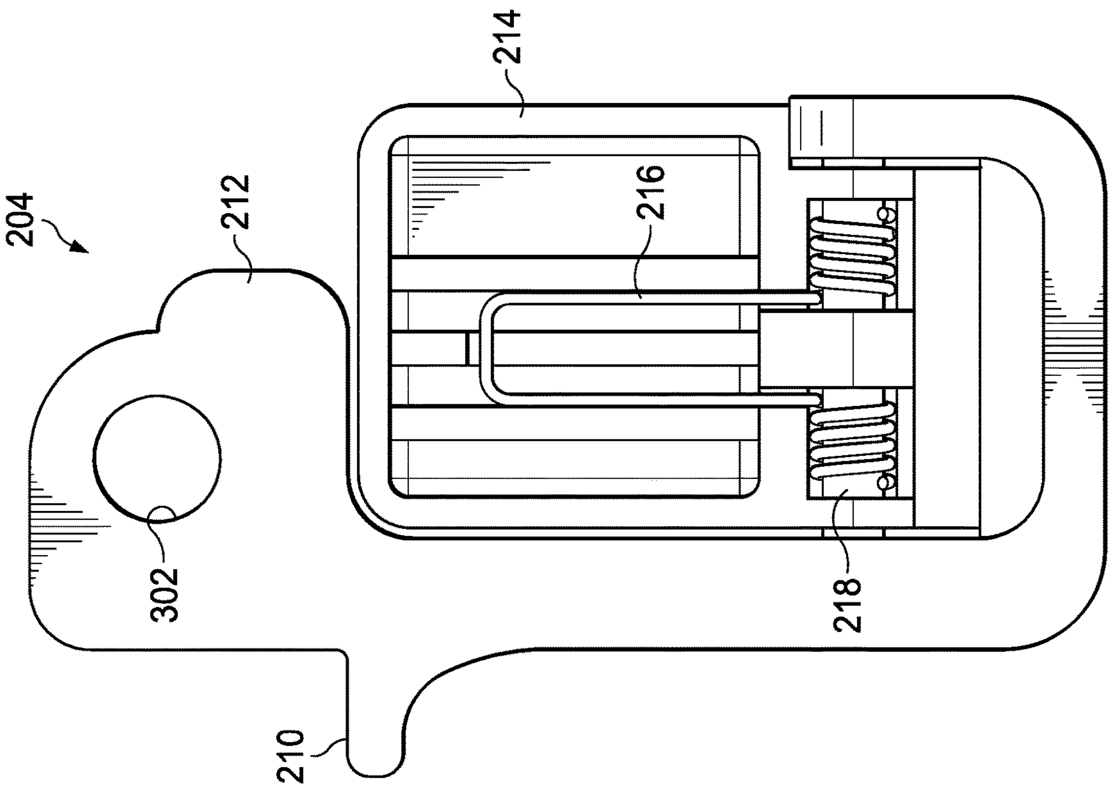
FIGS. 3A-3C illustrate various views of a slim profile latch, in accordance with embodiments of the present disclosure.
Figure 3A:
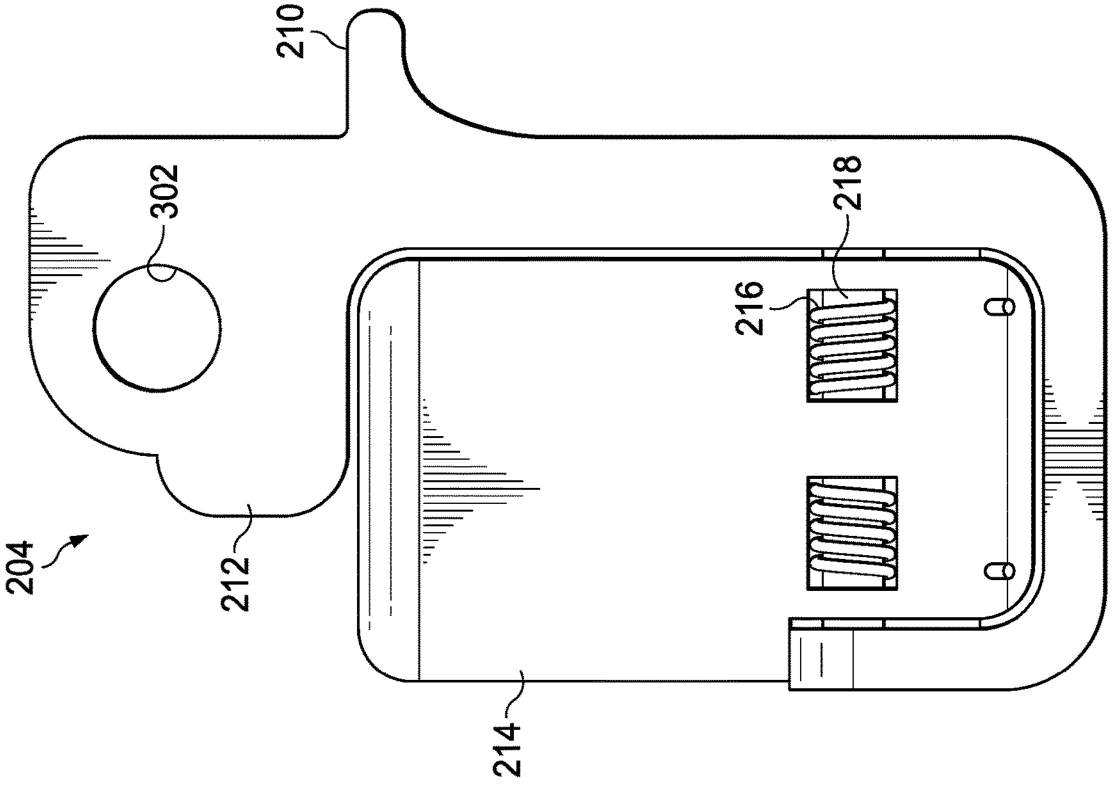
Figure 3C:
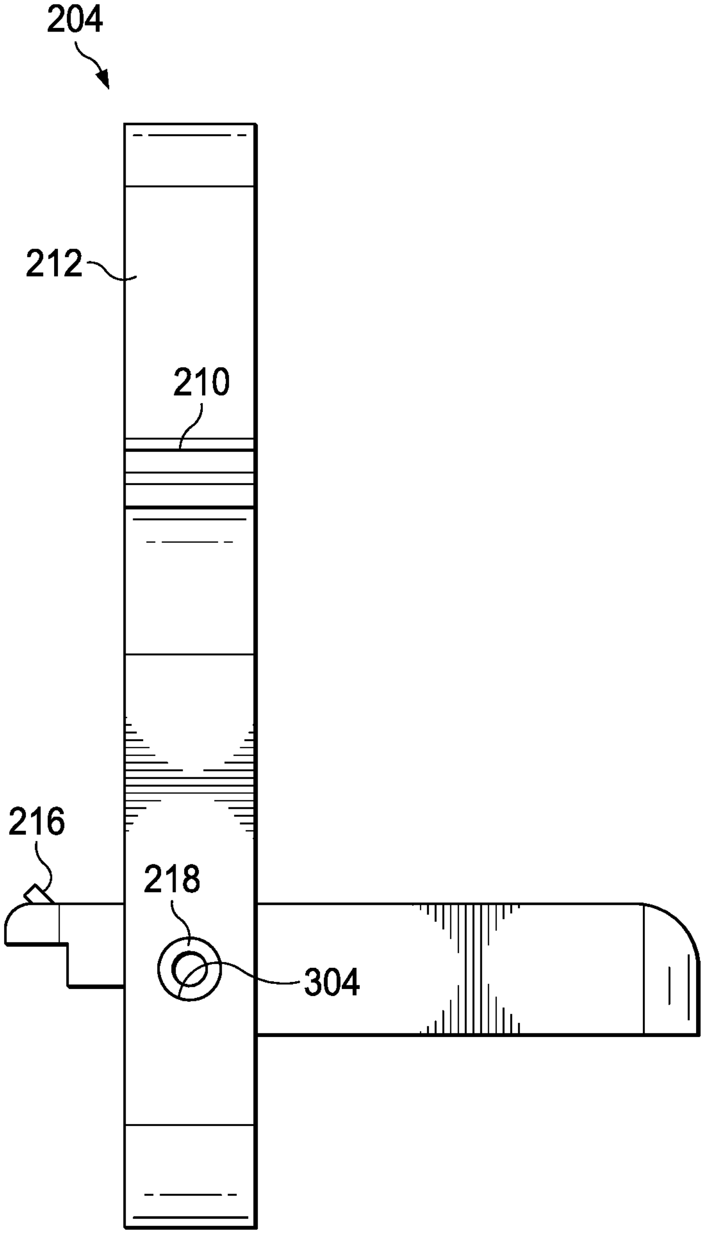

FIGS. 2A-2C illustrate a detailed front perspective view of an example modular information handling resource 102 including a slim profile latch 204, in accordance with embodiments of the present disclosure. FIGS. 3A-3C illustrate various views of slim profile latch 204, in accordance with embodiments of the present disclosure.

As shown in FIGS. 2A-2C, latch 204 may be rotatably coupled to a housing of information handling resource 102 via a bearing 206 which may pass through an opening 208 on a side of the housing, such that latch 204 may rotate, in response to a suitable mechanical force applied to latch 204 by a person (e.g., administrator or information technology technician) to a flange 210 extending from a body 212 of latch 204, relative to the housing about an axis defined by bearing 206 and in a plane perpendicular to a face 202 of the housing and in a direction perpendicular to face 202. Face 202 may comprise a surface of the housing of information handling resource 102 that is visible when information handling resource 102 is fully inserted into chassis 100. Accordingly, latch 204 may be rotated from a closed position relative to the housing of information handling resource 102 in which latch 204 predominantly resides within a latch cavity 213 of the housing (e.g., as shown in FIG. 2A) to an open position in which latch 204 is predominantly removed from latch cavity 213 (e.g., as shown in FIG. 2B), and vice versa. The degree of rotation from the closed position may be limited by interaction of flange 210 with face 202.

Although not shown in the figures, in some embodiments, a spring may be mechanically coupled between bearing 206 and latch 204 in order to bias latch 204 in the closed position, thus returning latch 204 to the closed position after use (e.g., in the absence of a force applied to the latch to overcome the spring force).

Further, as shown in FIGS. 2A-2C and 3A-3C, latch 204 may include a purchase 214 rotatably coupled to body 212 via a pin 218. A mechanical spring 216 may also be coupled between purchase 214 and/or either of body 212 and pin 218, such that when latch 204 is in the open position relative to the housing of information handling resource 102, purchase 214 may be rotated relative to latch 204 about an axis of rotation defined by pin 218 and parallel to the plane in which latch 204 rotates relative to the housing of information handling resource 102 from a first position (e.g., as shown in FIG. 2B) to a second position relative to latch 204 (e.g., as shown in FIG. 2C), and vice versa. Notably, in the first position, a profile of purchase 214 as viewed directly (e.g., "head on") from the front of face 202 may rest entirely within a profile of body 212.

In some embodiments, spring 216 may be configured to mechanically bias purchase 214 in the first position relative to latch 204, such that purchase 214 may be translated to a second position relative to latch 204 under a force applied (e.g., by a person) to purchase 214 that overcomes a spring force of spring 216.

When purchase 214 is translated to the second position relative to latch 204, purchase 214 may give a person a mechanical advantage for removing information handling resource 102 from chassis 100. For example, by applying a mechanical force to purchase 214 in a direction normal to face 202, the person may apply a sufficient force to overcome the mechanical forces that retain information handling resource 102 within chassis 100, and information handling resource 102 may slide out from chassis 100.

FIGS. 3A-3C depict latch 204 isolated from the housing of information handling resource 102. FIG. 3A illustrates a side view of latch 204 with purchase 214 in the first position relative to body 212. FIG. 3B illustrates a view of latch 204 from a side opposite that shown in FIG. 3A, with purchase 214 in the first position relative to body 212. FIG. 3C illustrates a top view of latch 204 normal to the views of FIGS. 3A and 3B.

FIGS. 3A-3C depict greater detail of the mechanical coupling of purchase 214 to body 212 via pin 218, and the coupling of spring 216 between purchase 214 and either of body 212 and pin 218. FIGS. 3A and 3B also show a bearing opening 302 via which bearing 206 may be received to rotatably couple body 212 to the housing of information handling resource 102. FIG. 3C further depicts that body 212 may have one or more openings 304 formed therein configured to receive pin 218.

When in the open position, and whether or not purchase 214 is in its first position or second position, latch 204 may also be used as a feature (e.g., a handle) to allow a person to carry and/or lift information handling system 102 when it is removed from chassis 100.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling resource, comprising: a housing configured to enclose components of the information handling resource; and a latch including: a body mechanically coupled to the housing; and a purchase rotatably coupled to the body via a purchase pin, wherein a first end of the purchase pin is received in a first opening of the body and a second end of the purchase pin is received in a second opening of the body; wherein: the latch is rotatable relative to the housing about an axis parallel to an exterior face of the housing and within a plane perpendicular to the exterior face such that the body is rotatable from a cavity on the exterior face of the housing to an open position relative to the housing and vice versa; and the purchase is rotatable relative to the body about an axis parallel to the plane in which the body rotates relative to the housing such that the purchase is rotatable from a first position relative to the body to a second position relative to the body and vice versa, such that when in the second position, the purchase provides a mechanical advantage for removal of the information handling resource from an information handling system.

2. The information handling resource of claim 1, further comprising a bearing mechanically interfaced between the housing and the body that defines the axis of rotation between the housing and the body.

3. The information handling system of claim 1, wherein:
the housing further comprises a latch cavity; and
the latch substantially resides within the latch cavity in the closed position.

4. The information handling system of claim 1, the body further comprising a flange extending therefrom that limits rotation of the body relative to the housing.

5. The information handling resource of claim 1, the latch further comprising a spring mechanically coupled between the body and the purchase such that a spring force of the spring mechanically biases the purchase in the first position relative to the body.

6. The information handling resource of claim 1, wherein, in the first position, the profile of the purchase as viewed directly from a direction perpendicular to the face rests entirely within a profile of the body.

7. A latch comprising: a body rotatably coupled to a housing of an information handling system; and a purchase rotatably coupled to the body via a purchase pin, wherein a first end of the purchase pin is received in a first opening of the body and a second end of the purchase pin is received in a second opening of the body; wherein: the latch is rotatable relative to the housing about an axis parallel to an exterior face of the housing and within a plane perpendicular to the exterior face such that the body is rotatable from a cavity on the exterior face of the housing to an open position relative to the housing and vice versa; and the purchase is rotatable relative to the body about an axis parallel to the plane in which the body rotates relative to the housing such that the purchase is rotatable from a first position relative to the body to a second position relative to the body and vice versa, such that when in the second position, the purchase provides a mechanical advantage for removal of the information handling resource from an information handling system.

8. The latch of claim 7, the body further comprising an opening configured to receive a bearing between the housing and the body that defines the axis of rotation between the housing and the body.

9. The latch of claim 7, the body further comprising a flange extending therefrom that limits rotation of the body relative to the housing.

10. The latch of claim 7, further comprising a spring mechanically coupled between the body and the purchase such that a spring force of the spring mechanically biases the purchase in the first position relative to the body.

11. The latch of claim 7, wherein, in the first position, the profile of the purchase as viewed directly from a direction perpendicular to the face, when the latch is mechanically coupled to the housing, rests entirely within a profile of the body.

12. A method comprising: rotatably coupling a body of a latch to a housing of an information handling resource and rotatably coupled to the body via a purchase pin, wherein a first end of the purchase pin is received in a first opening of the body and a second end of the purchase pin is received in a second opening of the body; wherein: the latch is rotatable relative to the housing about an axis parallel to an exterior face of the housing and within a plane perpendicular to the exterior face such that the body is rotatable from a cavity on the exterior face of the housing to an open position relative to the housing and vice versa; and the purchase is rotatable relative to the body about an axis parallel to the plane in which the body rotates relative to the housing such that the purchase is rotatable from a first position relative to the body to a second position relative to the body and vice versa, such that when in the second position, the purchase provides a mechanical advantage for removal of the information handling resource from an information handling system.

13. The method of claim 12, further comprising mechanically interfacing a bearing between the housing and the body that defines the axis of rotation between the housing and the body.

14. The method of claim 12, further comprising forming a latch cavity in the housing, such that the latch substantially resides within the latch cavity in the closed position.

15. The method of claim 12, further comprising forming a flange extending from the body that limits rotation of the body relative to the housing.

16. The method of claim 12, further comprising mechanically coupling a spring between the body and the purchase such that a spring force of the spring mechanically biases the purchase in the first position relative to the body.

17. The method of claim 12, further comprising arranging the body and the purchase such that, in the first position, the profile of the purchase as viewed directly from a direction perpendicular to the face rests entirely within a profile of the body.

* * * * *